United States Patent

Chen et al.

[11] Patent Number: 6,141,268
[45] Date of Patent: Oct. 31, 2000

[54] COLUMN REDUNDANCY IN SEMICONDUCTOR MEMORIES

[75] Inventors: Lidong Chen; Arun Achynthan, both of Nepean; John Wu, Ottawa, all of Canada

[73] Assignee: Mosaid Technologies Incorporated, Kanata, Canada

[21] Appl. No.: 09/348,314

[22] Filed: Jul. 7, 1999

Related U.S. Application Data

[63] Continuation of application No. 08/904,153, Jul. 31, 1997, Pat. No. 5,959,903.

[30] Foreign Application Priority Data

Apr. 14, 1997 [CA] Canada ................................. 2202692

[51] Int. Cl.[7] ...................................................... G11C 7/00
[52] U.S. Cl. .................. 365/200; 365/225.7; 365/189.02
[58] Field of Search .................................. 365/200, 225.7, 365/189.02, 230.02, 230.06

[56] References Cited

U.S. PATENT DOCUMENTS

| | | |
|---|---|---|
| 4,691,301 | 9/1987 | Anderson . |
| 5,394,368 | 2/1995 | Miyamoto . |
| 5,568,061 | 10/1996 | McClure ................................. 365/200 |
| 5,621,691 | 4/1997 | Park . |
| 5,646,896 | 7/1997 | Pinkham . |
| 5,657,279 | 8/1997 | Savignac et al. . |
| 5,675,543 | 10/1997 | Rieger . |
| 5,732,030 | 3/1998 | Dorney . |
| 5,787,046 | 7/1998 | Furuyama et al. . |

*Primary Examiner*—Vu A. Le
*Attorney, Agent, or Firm*—Kevin Pillay

[57] ABSTRACT

This invention describes a column redundancy arrangement in a DRAM that minimizes the timing difference between a normal and a redundant column path. A semiconductor memory device comprises memory elements arranged in rows and columns. The memory elements are accessed by energizing one or more rows and columns. A first and a second group of normal column drivers are provided for energizing associated normal memory columns in response to respective ones of column select signals. Further, a first and second redundant column driver are provided for energizing associated redundant memory columns upon receipt of a column select signal along a redundancy select line. A plurality of programmable switches are associated with the normal column drivers, for selectively steering respective ones of the column select signals to associated column drivers or the first or second of the redundant column drivers.

6 Claims, 6 Drawing Sheets

COLUMN REDUNDANCY IN SEMICONDUCTOR MEMORIES

This is a Continuation of U.S. application Ser. No. 08/904,153, filed Jul. 31, 1997 U.S. Pat. No. 5,959,903.

This invention relates to semiconductor memories and in particular to semiconductor memories having a flexible and efficient structure for substituting redundant columns for defective columns in a large memory.

BACKGROUND OF THE INVENTION

Semiconductor random access memories (RAMs) are typically formed of rowlines and columns crossing the rowlines. Capacitors adjacent each crossing of the rowlines and columns store charge, designating the data to be stored. The capacitors are switched to the columns in order to receive or discharge charge upon receipt of an appropriate voltage on the rowlines. The rowlines and columns are selected so as to read and write to particular capacitors by means of row (or X) decoders and column (or Y) decoders.

There are sometimes physical faults associated with the columns or associated elements. For this reason, RAMs usually contain redundant (spare) columns which involve the provision of extra memory elements and column circuitry. The extra memory and required redundant decoders to access that memory in place of defective columns uses valuable semiconductor chip area and decreases the area efficiency of the memory. As the occurrence of defective columns is a reality with which a chip manufacturer has to adapt to, various schemes have been devised to allow replacing faulty columns with redundant columns at manufacture time.

For example, in synchronous dynamic random access memories (SDRAMs), a first of these techniques utilizes an Y address comparator, wherein pre-decoded Y address signals (PY1:N) pass through fuses to generate redundant column enable signals (RCE) which is shown in FIG. 1. The fuses associated with the redundancy comparator, having inherent capacitance and resistance, which add an extra delay in the Y redundant path.

A second technique involves an Y address detector wherein Y address signals (AY(N-1:0)) control NMOS gates that connect to a pre-charged node through fuses and each generate redundant column enable signals as shown in FIG. 2. When a Y address matches a fuse programming pattern, a column redundant enable signal (COL_RED_EN) is maintained high in order to indicate that the column corresponding to the current Y address will be replaced by a redundant one. Because of this redundancy detecting circuit, timing between the normal and the redundant column path is usually different. Additional logic circuits are required to adjust the timing difference, i.e. time delay circuit must be employed in the normal address path in order to compensate for the slower redundant path.

A further technique known as a shift replacement Y decoder utilizes fuses in the Y decoders. Generally, two Y select lines share one group of fuses. In order to replace a column, the column is simply disabled by blowing the fuse inside the Y decoder. Shifting the Y driver access for the defective block over to an adjacent driver completes replacement. An advantage of this system is that fuses are not connected in the column address path and, therefore, no difference in timing between the normal and redundant path exists. Furthermore, block replacement is possible (failed columns can be repaired in each block with different decoding of each block). A disadvantage of this system is that two adjacent Y select lines must be replaced at the same time making this technique less flexible than other techniques. Furthermore, one directional shifting is required of the columns and shorts between adjacent Y select lines which do not form pairs cannot be repaired.

A variation on the above technique is implemented in which fuses are located outside the Y decoders and the fuse circuit is similar to that shown in FIG. 2.

Thus, it may be seen that there is a need for a redundancy scheme that eliminates the timing difference between normal and redundant column paths and which reduces the number of fuses and provides greater flexibility in repairing faulty columns.

SUMMARY OF THE INVENTION

This invention seeks to provide a column redundancy method and apparatus in a semiconductor memory that minimizes the timing difference between a normal column address path and a redundant column address path and which minimizes the number of fuses required in repairing faulty columns.

In accordance with the present invention, there is provided a semiconductor memory device comprises memory elements arranged in rows and columns. The memory elements are accessed by energizing one or more rows and columns. A first and a second group of normal column drivers are provided for energizing associated normal memory columns in response to respective ones of column select signals. Further, a first and second redundant column driver are provided for energizing associated redundant memory columns upon receipt of a column select signal along a redundancy select line. A plurality of programmable switches are associated with the normal column drivers, for selectively steering respective ones of the column select signals to associated column drivers or the first or second of the redundant column drivers.

BRIEF DESCRIPTION OF THE DRAWINGS

A better understanding of the invention will be obtained by reference to the detailed description below in conjunction with the following drawings in which.

DETAILED DESCRIPTION OF A PREFERRED EMBODIMENT

By way of background, memory cells in random access memory such as SDRAM and DRAM are arranged in rows and columns. Each of the columns is energized by drivers, which receive as inputs a decoded memory address from an Y address decoder. These decoded addresses are then fed into Y drivers that energize their associated columns in order to access the appropriate memory cells.

Figure 1:
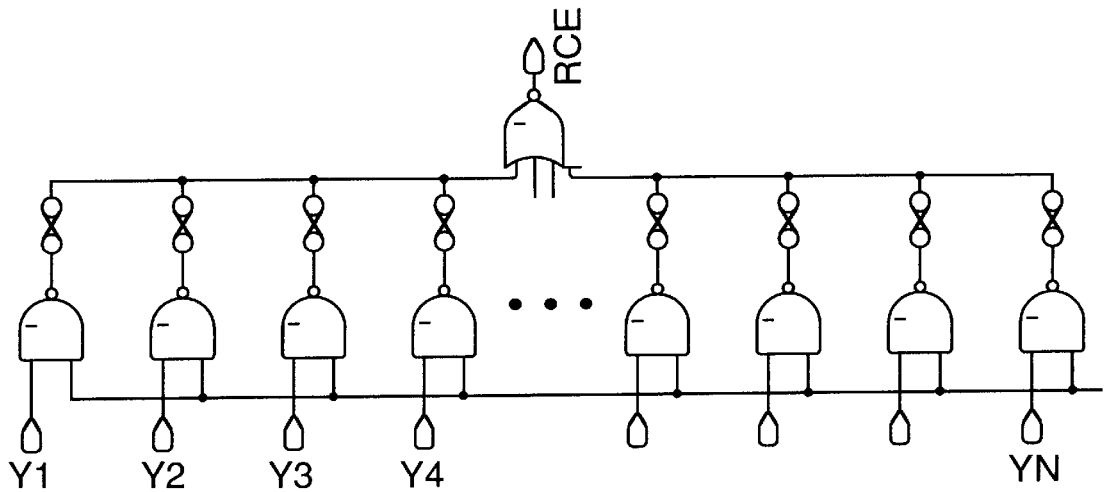
FIG. 1 illustrates a redundancy programming circuit according to the prior art.
Figure 2:
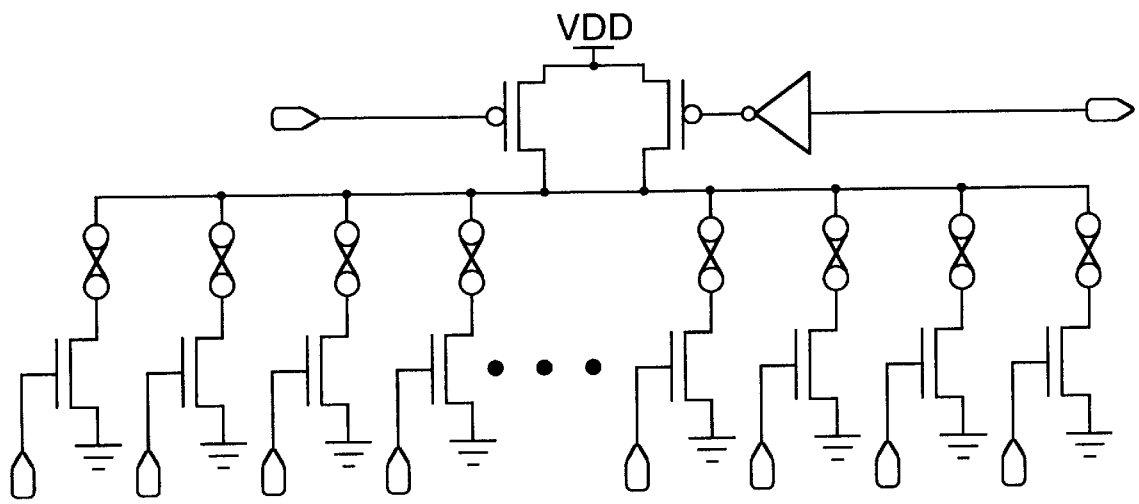
FIG. 2 indicates a further redundancy programming circuit according to the prior art.
Figure 3A:
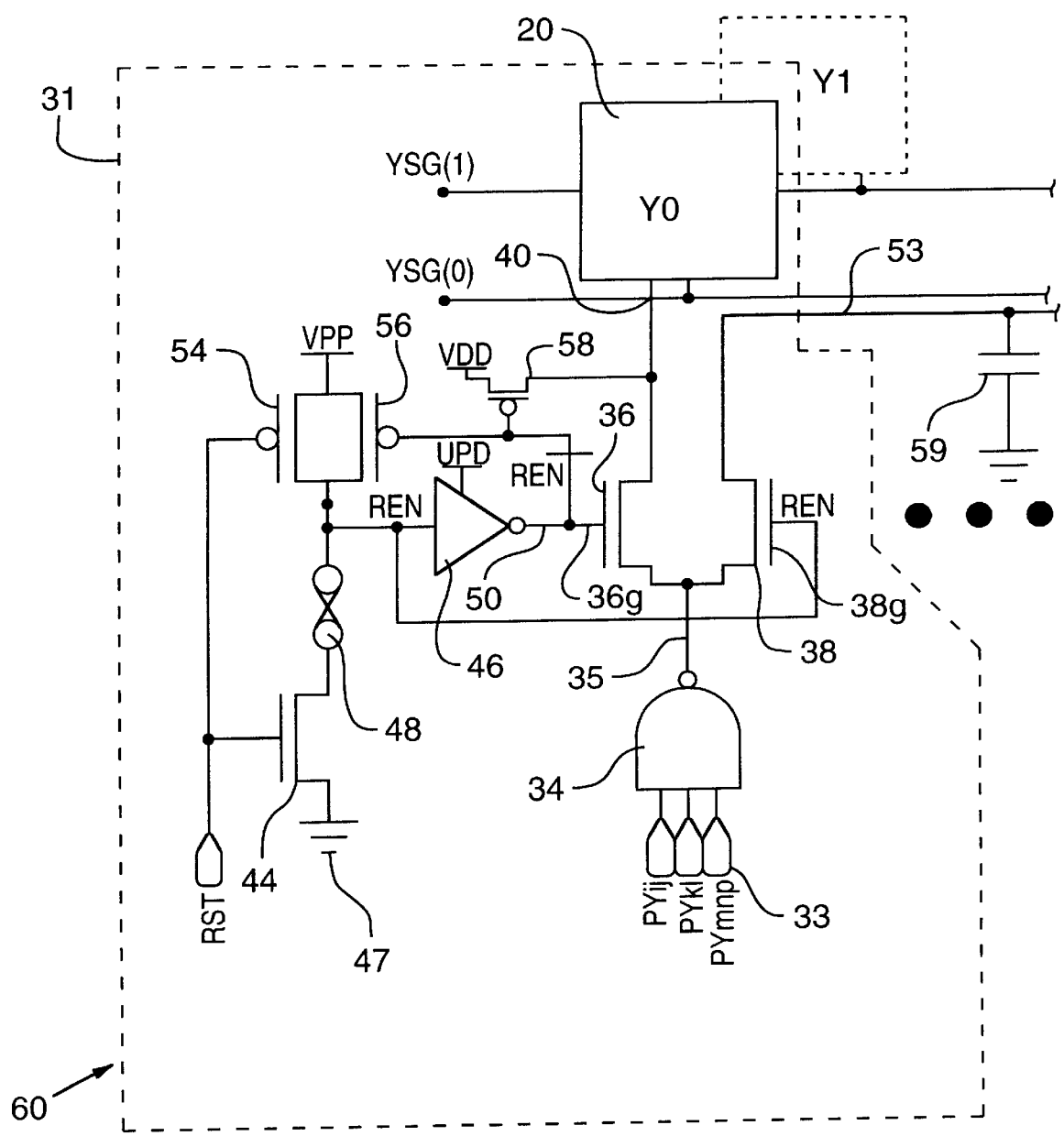
FIG. 3 is a schematic diagram of a redundancy configuration that may be used in the present invention.
Figure 3B:
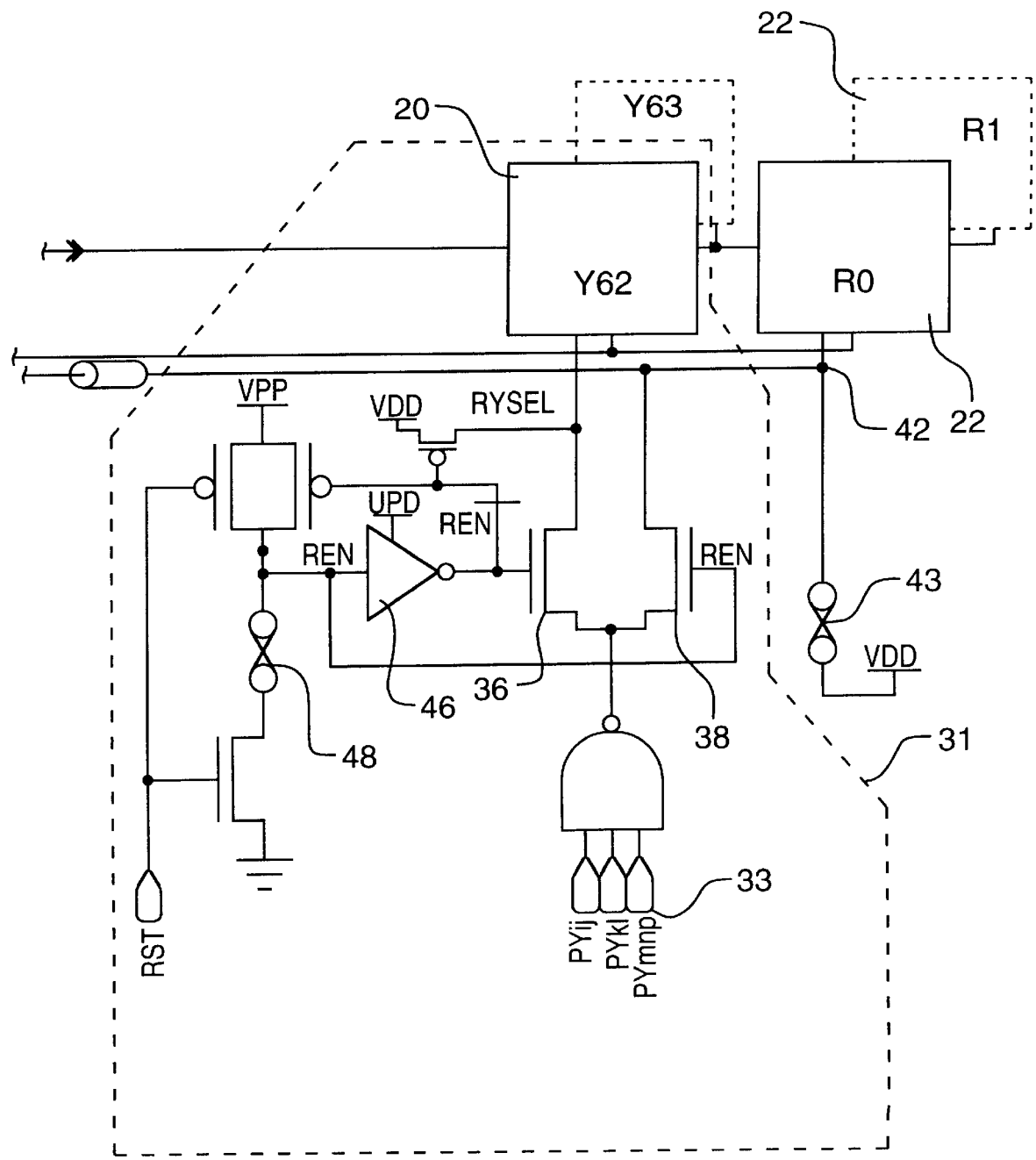

Referring now to FIG. 3, an embodiment of a column redundancy scheme according to the present invention is shown generally by numeral 30. More specifically, the column redundancy scheme illustrated is that for a 16-megabit (Mbit) SDRAM. In this architecture in order to access 256 columns, for example, sixty-four normal column drivers 20 are provided, which are arranged in two banks of thirty two drivers each, numbered Y0, Y2, Y4 . . . Y62 and Y1, Y3, Y5 . . . Y63 respectively. Each of the normal column drivers drives a group of four memory columns (not shown). The structure of the memory columns is well known in the art. The SDRAM also includes two redundant columns with their associated drivers R0 and R1 (one for each of the two banks).

Each column driver has associated therewith address decoder and switching circuitry as indicated by block 30. For the sake of simplicity the circuit configuration for a redundancy scheme according to the present invention will be described with reference to the single circuit block 30 associated with normal driver Y0, however this circuit block 30 is duplicated for each of drivers Y1 to Y63 respectively. Thus referring to the circuit shown in block 30, pre-decoded address signals PYl.j, PYk.1, PYm.n.p indicated by numeral 33 are applied to the inputs of a NAND gate 34. The output 35 of the NAND gate is coupled to an input 40 of normal driver Y0, via a switch formed by first and second NMOS transistors 36 and 38, respectively. The first NMOS transistor 36 has its source-drain circuit connected between the output node 35 of the NAND gate 34 and the input 40 of normal driver Y0. The second NMOS transistor 38 has its source-drain circuit connected between the output node 35 of the NAND gate 34 and an input node 42 of redundant driver R0. The input node 42 of redundant driver R0 is held high by a fuse 43 connected between a VDD supply and the input node 42. The gate 36g of the first transistor 36 and the gate 38g of the second transistor 38 are each connected to complementary signals $\overline{REN}$ and REN, respectively. The $\overline{REN}$ signal is derived from the output of a Vpp powered inverter 46, which has connected to its input the signal REN. A fuse 48 is connected at one end thereof to the input of the inverter 46. The other end of the fuse is connected to an NMOS transistor 44, which has its source-drain circuit connected between a ground node 47 the fuse 48. When enabled, transistor 44 maintains REN "low" if no redundancy is required. First and second PMOS transistors 54 and 56 respectively have their respective source-drain circuits connected between the VPP voltage supply and the input node of the inverter 46. The VPP supply is an internally generated boosted voltage supply derived from a VDD level supply voltage. The gate of the first PMOS transistor 54 is connected to the gate of the NMOS transistor 44 that in turn is connected to a reset input RST. The RST input signal is derived from an external source (not shown). The gate of the second PMOS transistor 56 is connected to the gate of the first NMOS transistor 36. A pass-gate formed by a PMOS transistor has its source-drain circuit connected between the VDD supply and the source output of the first NMOS transistor 36. The gate of the pass-gate PMOS transistor is also connected to the gate of the first NMOS transistor 36.

The operation of the circuit 30 may now be explained as follows. When an appropriate pre-decoded column address signal is received at the input of the NAND gate 34 the decoded column address output 35 is steered either to the normal column decoder Y0 or to the redundant column decoder R0 via bus RYSEL, depending on whether the fuse 48 is either blown or intact. This "steering" of the address signal is achieved by setting either one of the first and second NMOS transistors 36 and 38, respectively, on or off. Application of an appropriate gate signal REN or $\overline{REN}$ to either first or second NMOS transistor 36 or 38, respectively, will connect the decoded column address output from NAND gate 34 to one of the normal Y driver Y0 or the redundant Y driver R0, respectively. In normal operation (i.e. without a redundant Y driver in the address path) the fuse 48 is intact, thus pulling the input of the inverter 46 low through the NMOS transistor 44 when RST is held high. This low level signal REN at the input of the inverter 46 produces a high level at its output 50 which is in turn provides the high $\overline{REN}$ signal to the gate of transistor 36, turning this transistor on and thus steering an input address to the normal driver Y0. The gate of transistor 38 is held low in normal operation, thus, turning off transistor 38.

During manufacture, for example if a fault is detected in the column corresponding to normal column driver Y0, the redundancy driver R0 and its associated redundant column is switched into the address path to replace Y0. This is achieved by blowing fuse 48 and the fuse 43. Thus when power is applied to the memory the gate of transistor 38 is pulled high via the pair of pull-up PMOS transistors 54 and 56, thus driving signal REN high. This then drives the output from the inverter 46 low, producing output signal $\overline{REN}$. The low level $\overline{REN}$ signal applied at the gate of transistor 36 turns this transistor off thus, disconnecting the normal driver Y0 from the output of the NAND gate 34 and allowing the decoded address output 35 to be steered via the second transistor to the redundant driver R0 connected to the RYSEL line. Thus redundant driver R0 and its associated columns are addressed using the same address path as the normal driver, i.e. via NAND gate 34. As a result, there is no timing difference created between accessing a normal or a redundant memory column.

In order to ensure that the initial state of the transistors and the appropriate voltages are applied to the nodes, the RST signal is applied to the RST input. The RST signal is normally held low at power up of the memory, prior to addressing the columns, and is brought to a full supply voltage after a delay. The RST signal enables the VPP supply voltage to be applied to the appropriate REN or $\overline{REN}$ signals and for the appropriate transistor 36 or 38 transistors to switch in the selected replacement redundancy drivers if the fuse 48 is blown or allow a normal column driver to be used.

As may also be seen, the circuit illustrated by FIG. 3 is arranged such that the group of normal columns associated with one of column drivers Y0, Y2, Y4 . . . Y62 may be replaced by the redundant column associated with redundant driver R0. Similarly, normal columns associated with one of column drivers Y1, Y3, Y5 . . . Y63 may be replaced by redundant columns associated with redundant driver R1. Furthermore, although the above was described with reference to a single normal driver Y0, a similar description and implementation of the circuitry applies to normal drivers Y1 to Y63. By associating odd and even numbered Y select lines with corresponding redundant drivers it is possible to repair shorts between any two adjacent Y select lines.

In the configuration described above, one redundant driver is provided per thirty-two normal drivers. Thus a redirected address must be steered along a single RYSEL line. Because of the length of this line, there exists a junction capacitance $C_j$ 59 and some resistance in the redundancy select line RYSEL created by the associated circuitry connected to the RYSEL line which cause an RC delay when RYSEL is pulled high or low. In order to reduce this junction capacitance $C_j$, the circuit utilizes NMOS transistors 36 and 38 as pass gates instead of CMOS transistors. This further requires the use of Vpp in order to fully turn on either transistor 36 or 38 which are NMOS devices. The selection of NMOS devices as pass gates over PMOS or a combination of NMOS and PMOS is due to the fact that NMOS devices have a lower capacitance than PMOS devices. Clearly, this represents a refinement and not a limitation to the implementation of the present invention. The voltage VDD and full pass gates using both NMOS and PMOS could also be used.

Figure 4:
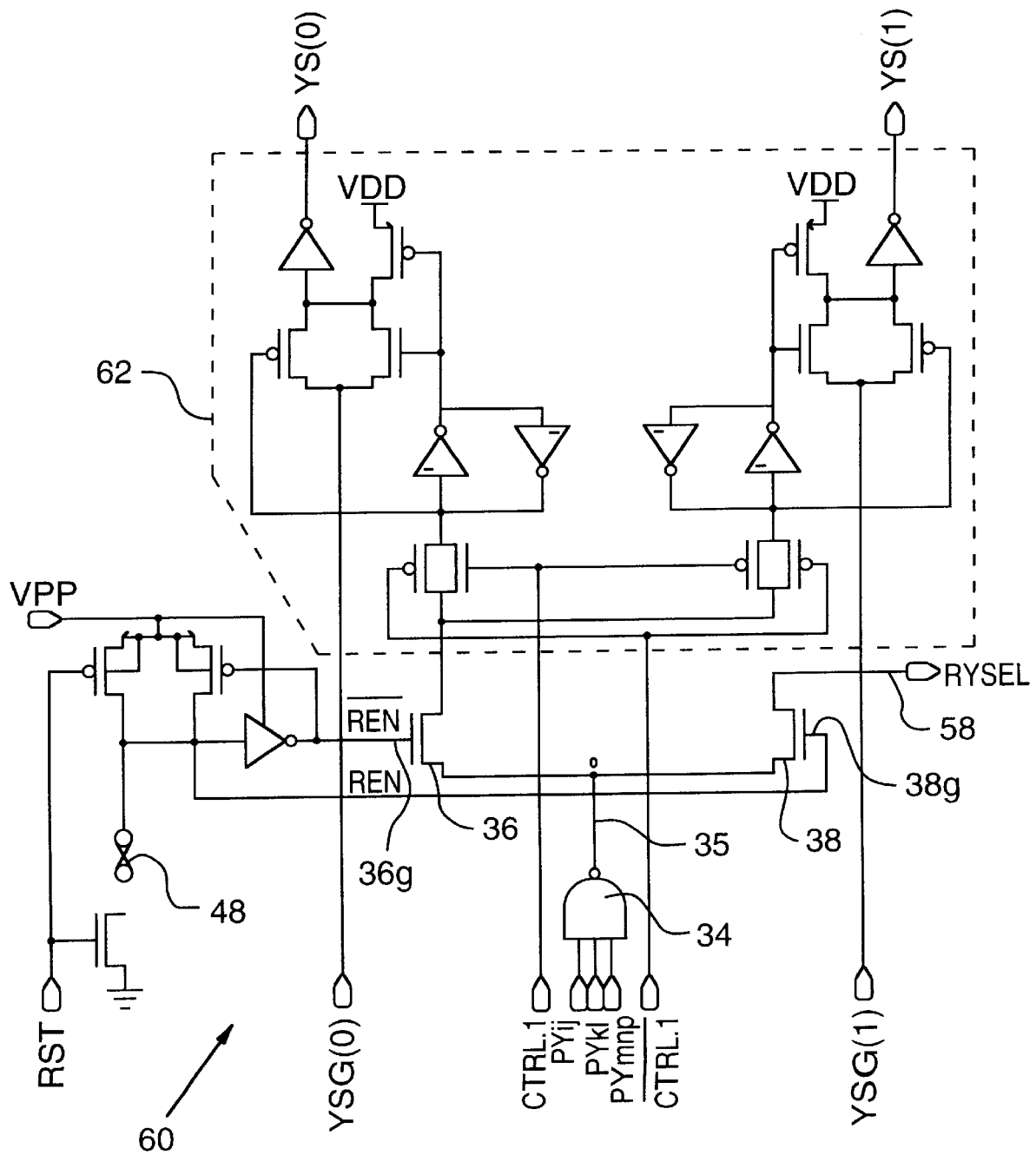
FIG. 4 is a schematic circuit diagram of a normal column decoder as may be used in the present invention.

Referring now to FIG. 4, a schematic diagram of a normal Y driver is shown generally by numeral 60. A block indicated by numeral 62 is a detailed implementation of a normal Y driver indicated as blocks Y0 to Y63 in FIG. 3. Such an implementation is already known in the art and, therefore, will not be discussed further. Other suitable driver circuit implementations may be equally well be used for block 62. The decoding-switching circuitry is as shown in FIG. 3. Furthermore, standard decoding or pre-decoding techniques can be used to generate the inputs 33 in FIG. 3.

Figure 5:
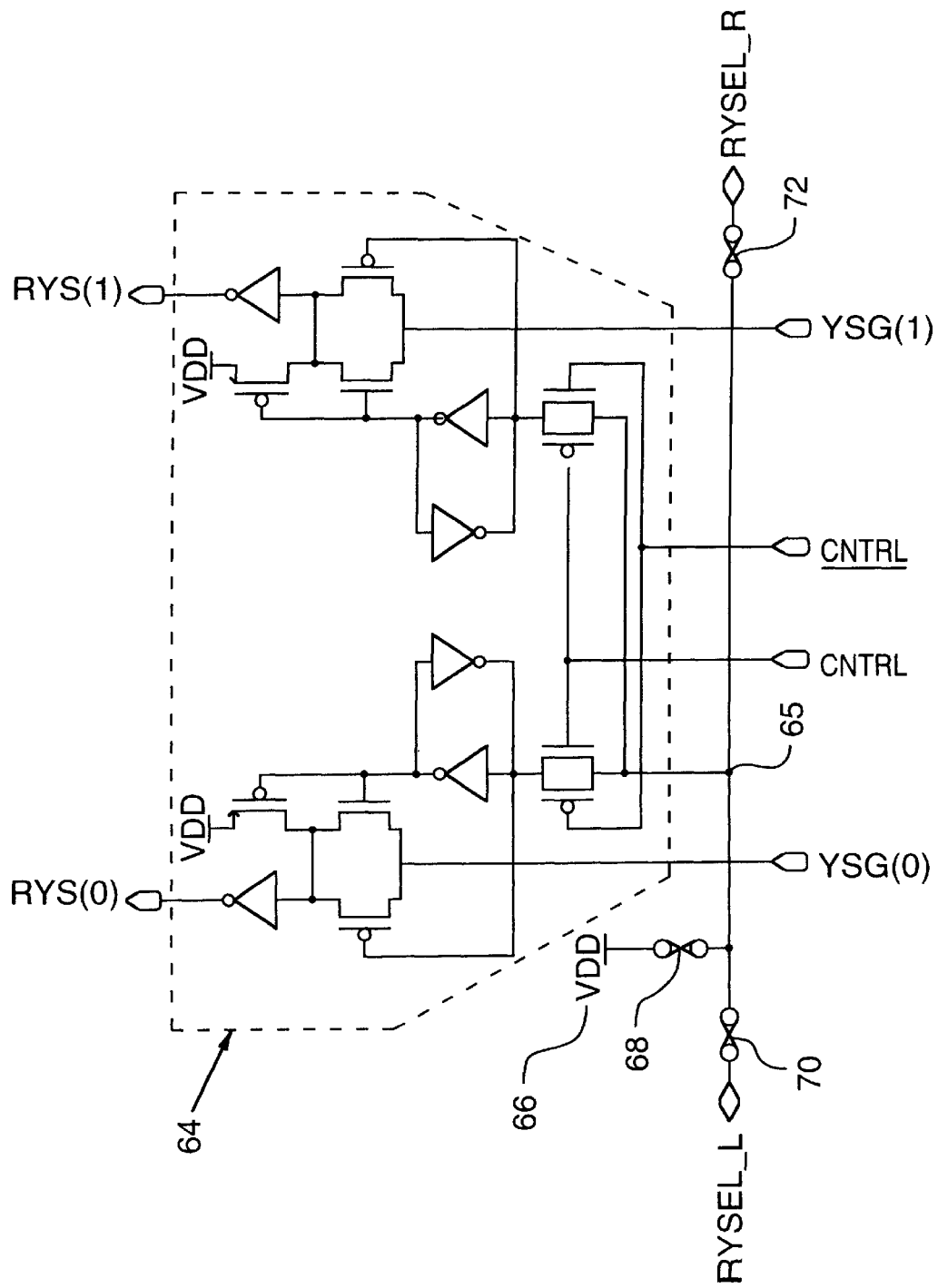
FIG. 5 is a schematic diagram of a redundant column decoder as may be used in the present invention.

Similarly, in FIG. 5, the block indicated by numeral 64 is a detailed implementation of the redundancy driver 20 R0 or R1 shown in FIG. 3. Once again, the circuitry indicated by block 64 is known in the art and may therefore be implemented by other similar driver circuitry.

It may also be seen with reference to FIG. 5 that a fuse is added on either side of the input node 65 of the RYSEL line to the redundant driver circuit 64. These fuses are indicated as RYSEL_L 70 and RYSEL_R 72. This further serves the effect of reducing the junction capacitance in RYSEL in half. A fuse 68 is connected between VDD 66 and the RYSEL line for each redundant driver R0 or R1. If the redundant driver R0 or R1 is not needed, all three fuses, 68, 70 and 72 are intact, allowing the RYSEL line to be connected to VDD 66. If a normal column decoder to the left, for example, of the redundant Y decoder R0 or R1 needs to be replaced, fuse 72 and fuse 68 are blown, and if the normal decoder to the right of the redundant decoder needs to be replaced, fuse 70 and fuse 68 are blown. By selectively blowing the fuses in this manner, the junction capacitance of the RYSEL line is minimized.

Thus, it may be seen that since both driver circuitry in a normal Y decoder and a redundant Y decoder are essentially the same, then the address signals are passed through similar paths to the appropriate memory bank and are not delayed by being passed through fuses. The embodiment described above may be implemented in a memory architecture as follows.

Figure 6:
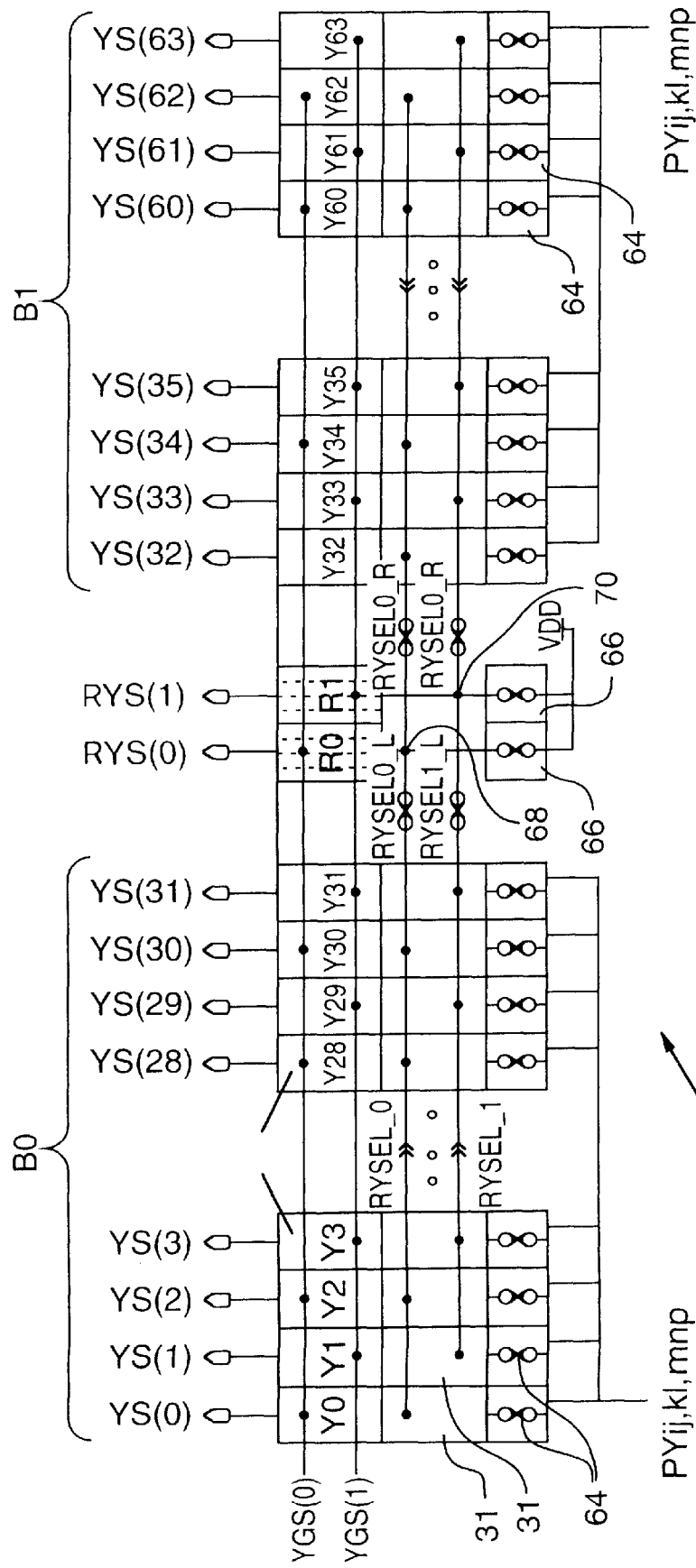
FIG. 6 is a schematic diagram of a layout of the normal and redundant decoders according to the present invention.

Referring to FIG. 6 an architectural implementation consisting of sixty-four normal column decoders and two redundant column decoders is shown generally by numeral 60. The normal column drivers Y0 to Y63 and their associated decoders and switching circuitry 31 correspond to those shown in FIG. 3. The fuse 48 shown in FIG. 3 is indicated schematically in FIG. 6 by numeral 64. As also described earlier with reference to FIG. 3, pre-decoded address signals $PY_{i,j}$, $PY_{k,1}$, $PY_{m,n,p}$ are applied to the decoders 31. The driver/decoders are arranged in two blocks B0 and B1, each block comprised of drivers Y0 to Y31 and Y32 to Y63 respectively arranged on either side of a pair of redundant column drivers R0 and R1. The redundant driver R0 may be connected to replace the columns addressed by odd numbered drivers Y1, Y3 . . . Y63 along a line RYSEL_0. While the redundant driver R1 may be connected to replace the columns addressed by even numbered drivers Y0, Y2 . . . Y62 along a line RYSEL_1. The fuses for maintaining the RYSEL_0 and RYSEL_1 lines high, referred to in FIG. 3 by the numeral 43, are indicated by numeral 66. In addition to these fuses, each of the redundant drivers R0 and R1 include a fuse RYSEL0_L, RYSEL0_R and RYSEL1_L, RYSEL1_R respectively connected on either side of their respective input nodes 68 and 70 and inline with their respective RYSEL lines; these fuses correspond to fuses 70 and 72 in FIG. 5.

In operation then, it may be seen that in order to replace a normal column with a redundant column, the appropriate fuse 66 to the redundant column is blown. The decoded address is then steered to the selected redundant column. It is also noted that one of the fuses to the left or right of the input node 70 to the redundant column is blown in order to minimize the capacitive effect of the RYSEL line to one of the unused banks B0 or B1.

It may also be seen that with this redundancy scheme, timing differences between normal column paths are eliminated and that the number of fuses reduced compared to the prior art which utilizes a fuse per address line. Furthermore, the memory capacity of the embodiment of FIG. 6 may be increased by repeating the circuit configuration.

As an additional feature, a U-type layout is used for the NMOS transistors 36 and 38, in order to reduce the capacitance of each device. As a still further step to reduce the junction capacitance, the normal drivers are arranged on either side of the adjunctant drivers as indicated in FIG. 6. This further serves the purpose of reducing the actual length of the RYSEL line by half.

By use of the present invention, the number of column decoders is minimized as the decoded column addresses are simply steered to the relevant redundant memory column(s). Generally, the speed critical path is affected by having gates in the path for switching address signals to the redundant columns, however with the present invention the presence of additional gates in the normal address path is obviated. Additionally the fuse controlling the switch that steers the normal address to the redundant column is not part of the address path.

While the invention has been described in connection with the specific embodiment thereof, and in a specific use, various modifications thereof will occur to those skilled in the art without departing from the spirit of the invention as set forth in the appended claims. For example, the number of redundant Y drivers associated with a group of normal Y drivers may be varied. Furthermore, the column redundancy system may be applied to all types of memories.

The terms and expressions which have been employed in this specification are used as terms of description and not of limitations, there is no intention in the use of such terms and expressions to exclude any equivalence of the features shown and described or portions thereof, but it is recognized that various modifications are possible within the scope of the claims to the invention.

What is claimed is:

1. A semiconductor memory device comprising:

a) memory elements arranged in rows and columns, said memory elements being accessed by energizing one or more rows and columns;

b) a first and a second group of normal column drivers for energizing associated normal memory columns in response to respective ones of column select signals;

c) a first and second redundant column driver for energizing associated redundant memory columns upon receipt of a column select signal along a redundancy select line;

d) a plurality of programmable switches associated with said normal column drivers, for selectively steering respective ones of said column select signals to associated column drivers or said first or second of said redundant column drivers.

2. A semiconductor memory device as defined in claim 1, said programmable input being programmed by a fuse.

3. A semiconductor memory device as defined in claim 2, said redundancy select line for coupling said first group of normal column drivers with said redundancy column driver via a first fuse, and said second group of normal column drivers with said redundancy column driver via a second fuse.

4. A semiconductor memory device as defined in claim 3, wherein said first fuse is blown when said switch is associated with said second group of normal column drivers and said second fuse is blown when said switch is associated with said first group of normal column drivers, thereby reducing a length of said redundancy select line for reducing a capacitive effect of said redundancy select line.

5. A semiconductor memory device as defined in claim 2, said switch comprising first and second NMOS transistors, said transistors being responsive to respective complementary signals applied to respective gates thereof for activating one of said transistors to thereby switch said input signal its outputs.

6. A semiconductor memory device as defined in claim 5, wherein said first and second NMOS transistors are arranged in a U-type layout for reducing a capacitive effect of said transistors.

\* \* \* \* \*